(12) United States Patent
Liu et al.

(10) Patent No.: US 10,840,265 B2
(45) Date of Patent: Nov. 17, 2020

(54) DISPLAY PANEL AND METHOD OF IMPROVING DISPLAY QUALITY IN PERIPHERAL REGIONS THEREOF

(71) Applicant: HANNSTAR DISPLAY CORPORATION, Taipei (TW)

(72) Inventors: Hsuan-Chen Liu, Kaohsiung (TW); Chien-Ting Chan, Tainan (TW); Chung-Lin Chang, Kaohsiung (TW)

(73) Assignee: HANNSTAR DISPLAY CORPORATION, Taipei (TW)

( * ) Notice: Subject to any disclaimer, the term of this patent is extended or adjusted under 35 U.S.C. 154(b) by 0 days.

(21) Appl. No.: 16/529,715

(22) Filed: Aug. 1, 2019

(65) Prior Publication Data
US 2020/0058242 A1    Feb. 20, 2020

(30) Foreign Application Priority Data
Aug. 14, 2018 (CN) .......................... 2018 1 0922464

(51) Int. Cl.
| | |
|---|---|
| H01L 27/12 | (2006.01) |
| H01L 27/32 | (2006.01) |
| G09G 3/20 | (2006.01) |
| G09G 3/36 | (2006.01) |
| G09G 3/3266 | (2016.01) |

(52) U.S. Cl.
CPC .......... *H01L 27/1214* (2013.01); *G09G 3/20* (2013.01); *G09G 3/3266* (2013.01); *G09G 3/3677* (2013.01); *H01L 27/124* (2013.01); *H01L 27/32* (2013.01); *G09G 2300/0426* (2013.01); *G09G 2300/0439* (2013.01); *G09G 2310/0232* (2013.01); *G09G 2310/0267* (2013.01); *G09G 2310/0286* (2013.01); *G09G 2320/0223* (2013.01); *G09G 2320/0233* (2013.01);
(Continued)

(58) Field of Classification Search
CPC ............. G09G 3/20; G09G 2300/0426; G09G 2300/0439; G09G 2320/0233; G09G 2320/0626; G09G 2310/0267; G09G 2320/0223; G09G 2310/0232; G09G 2310/0286; G09G 3/3677; G09G 3/3266; H01L 27/32; H01L 27/124; H01L 27/1214; H01L 27/3244; H01L 27/3276; H01L 27/3265
See application file for complete search history.

(56) References Cited

U.S. PATENT DOCUMENTS

2017/0337877 A1* 11/2017 Kim ..................... G09G 3/3225
2019/0189707 A1*  6/2019 Hyeon ................ H01L 51/5012

* cited by examiner

*Primary Examiner* — Darlene M Ritchie
(74) *Attorney, Agent, or Firm* — Winston Hsu

(57) ABSTRACT

A display panel includes a substrate having a display region and a peripheral region, first and second sub pixels, first and second gate driving units. The display region includes a first area having first scan lines and first sub pixels and a second area having second scan lines and second sub pixels. A portion of the first sub pixels and a portion of the second sub pixels are respectively electrically connected to the first and second scan line. The first gate driving unit includes a first driving transistor. The second gate driving unit includes a second driving transistor. The number of the first sub pixels driven by the first gate driving unit is less than the number of the second sub pixels driven by the second gate driving unit. The channel width of the first driving transistor is less than the channel width of the second driving transistor.

9 Claims, 11 Drawing Sheets

(52) U.S. Cl.
CPC .. *G09G 2320/0626* (2013.01); *H01L 27/3244* (2013.01); *H01L 27/3276* (2013.01)

DISPLAY PANEL AND METHOD OF IMPROVING DISPLAY QUALITY IN PERIPHERAL REGIONS THEREOF

CROSS REFERENCE TO RELATED APPLICATION

This application claims priority of China Application No. 201810922464.6, filed on Aug. 14, 2018. The entirety of the above-mentioned patent application is incorporated by reference herein and made a part of this specification.

BACKGROUND OF THE INVENTION

1. Field of the Invention

The present invention relates to a display panel and a method of improving the display quality of a display panel, and more particularly, to a display panel and a method of improving the display quality of a display panel by improving undesirable gray levels between areas with different shapes in a display region.

2. Description of the Prior Art

A display panel is formed by two substrates and a plurality of layers with various electrical components disposed between the two substrates. Since display panels are thin and light, have low power consumption and no radiation pollution, they are widely used in various portable or wearable electronic products such as notebooks, smart phones and watches, as well as vehicle displays, to provide more convenient information transmission and display.

Display regions of display panels may have different shapes, meaning the scanning signals may have different resistive-capacitive loading (RC loading) when they are transmitted to the display areas with different shapes. When the same scanning signal is input to pixels in different areas, a phenomenon where the gray levels are not consistent may occur, thereby causing uneven brightness indifferent areas of the display panel.

SUMMARY OF THE INVENTION

The technical problem to be solved by the present invention is that gray levels or the brightness of areas having different shapes in the display region of a display are not uniform.

To solve the above technical problem, the present invention provides a display panel including a substrate, a plurality of first sub pixels, a plurality of second sub pixels, a first gate driving unit, and a second gate driving unit. The substrate has a surface, wherein the surface includes a display region and a peripheral region disposed on at least one side of the display region, wherein the display region includes a first area and a second area, the first area has a first scan line and the second area has a second scan line. The first sub pixels are disposed in the first area, wherein at least a portion of the first sub pixels are electrically connected to the first scan line. The second sub pixels are disposed in the second area, wherein at least a portion of the second sub pixels are electrically connected to the second scan line. The first gate driving unit is disposed in the peripheral region, wherein the first gate driving unit has a first driving transistor, the first gate driving unit is electrically connected to the first scan line, and the portion of the first sub pixels electrically connected to the first scan line are driven through the first scan line by the first gate driving unit. The second gate driving unit is disposed in the peripheral region, wherein the second gate driving unit has a second driving transistor, the second gate driving unit is electrically connected to the second scan line, and the portion of the second sub pixels electrically connected to the second scan line are driven through the second scan line by the second gate driving unit. A number of the first sub pixels driven by the first gate driving unit is less than a number of the second sub pixels driven by the second gate driving unit, and a channel width of the first driving transistor is less than a channel width of the second driving transistor.

The present invention further provides a method of improving the display quality of a display panel, which includes the following steps. First, a layout design of a display panel is provided, which includes a substrate, a plurality of first sub pixels, a plurality of second sub pixels, a first gate driving unit and a second gate driving unit. The substrate has a surface, wherein the surface includes a display region and a peripheral region disposed on at least one side of the display region. The display region includes a first area and a second area, wherein the first area has a first scan line and the second area has a second scan line. The first sub pixels are disposed in the first area, wherein at least a portion of the first sub pixels are electrically connected to the first scan line. The second sub pixels are disposed in the second area, wherein at least a portion of the second sub pixels are electrically connected to the second scan line. The first gate driving unit is disposed in the peripheral region, wherein the first gate driving unit has a first driving transistor, the first gate driving unit is electrically connected to the first scan line, and the portion of the first sub pixels electrically connected to the first scan line are driven through the first scan line by the first gate driving unit. The second gate driving unit is disposed in the peripheral region, wherein the second gate driving unit has a second driving transistor, the second gate driving unit is electrically connected to the second scan line, the portion of the second sub pixels electrically connected to the second scan line are driven through the second scan line by the second gate driving unit, and the number of the first sub pixels driven by the first gate driving unit are less than the number of the second sub pixels driven by the second gate driving unit. Next, the RC loading of the first scan line and the RC loading of the second scan line are estimated. Then, a first driving unit modifying step is performed, including modifying a channel width of the first driving transistor according to an estimation result of the RC loadings of the first scan line and the second scan line. Next, a simulation on the first gate driving unit and the second gate driving unit is performed to obtain a plurality of signal output waveforms of the first gate driving unit and the second gate driving unit. Then, a second driving unit modifying step is performed, including modifying the channel width of the first driving transistor according to the signal output waveforms of the first gate driving unit and the second gate driving unit.

In the display panel and method of improving the display quality of the display panel according to the present invention, the channel width of the first driving transistor is reduced according to the RC loading of the first scan line, such that the driving power of the first gate driving unit is reduced, and the driving power of each of the first gate driving units may match the RC loading of the first scan line corresponding to each of the first gate driving units. Therefore, the transmission quality of the scanning signals in the first area and the second area may be consistent, and the problem of uneven brightness in different areas of the display panel is improved, which improves the display quality.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
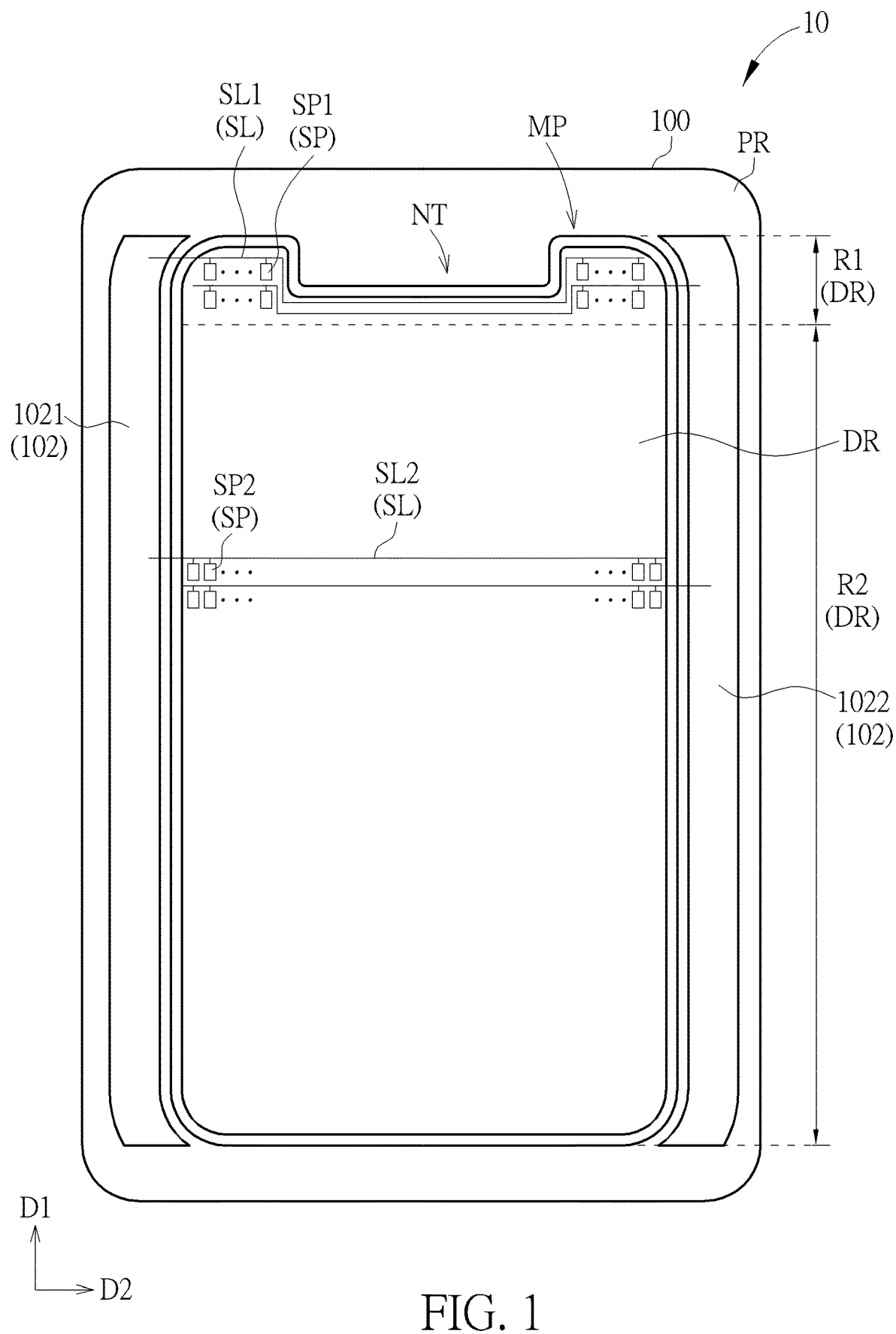
FIG. 1 is a schematic diagram illustrating a top view of a display panel according to a first embodiment of the present invention.

To provide a better understanding of the present invention to those skilled in the technology, embodiments will be detailed as follows. The embodiments of the present invention are illustrated in the accompanying drawings to elaborate on the contents and effects to be achieved. It should be noted that the drawings are simplified schematics, and therefore show only the components and combinations associated with the present invention, so as to provide a clearer description of the basic architecture or method of implementation. The components would be complex in reality. In addition, for ease of explanation, the components shown in the drawings may not represent their actual number, shape, and dimensions; details can be adjusted according to design requirements.

Figure 2:
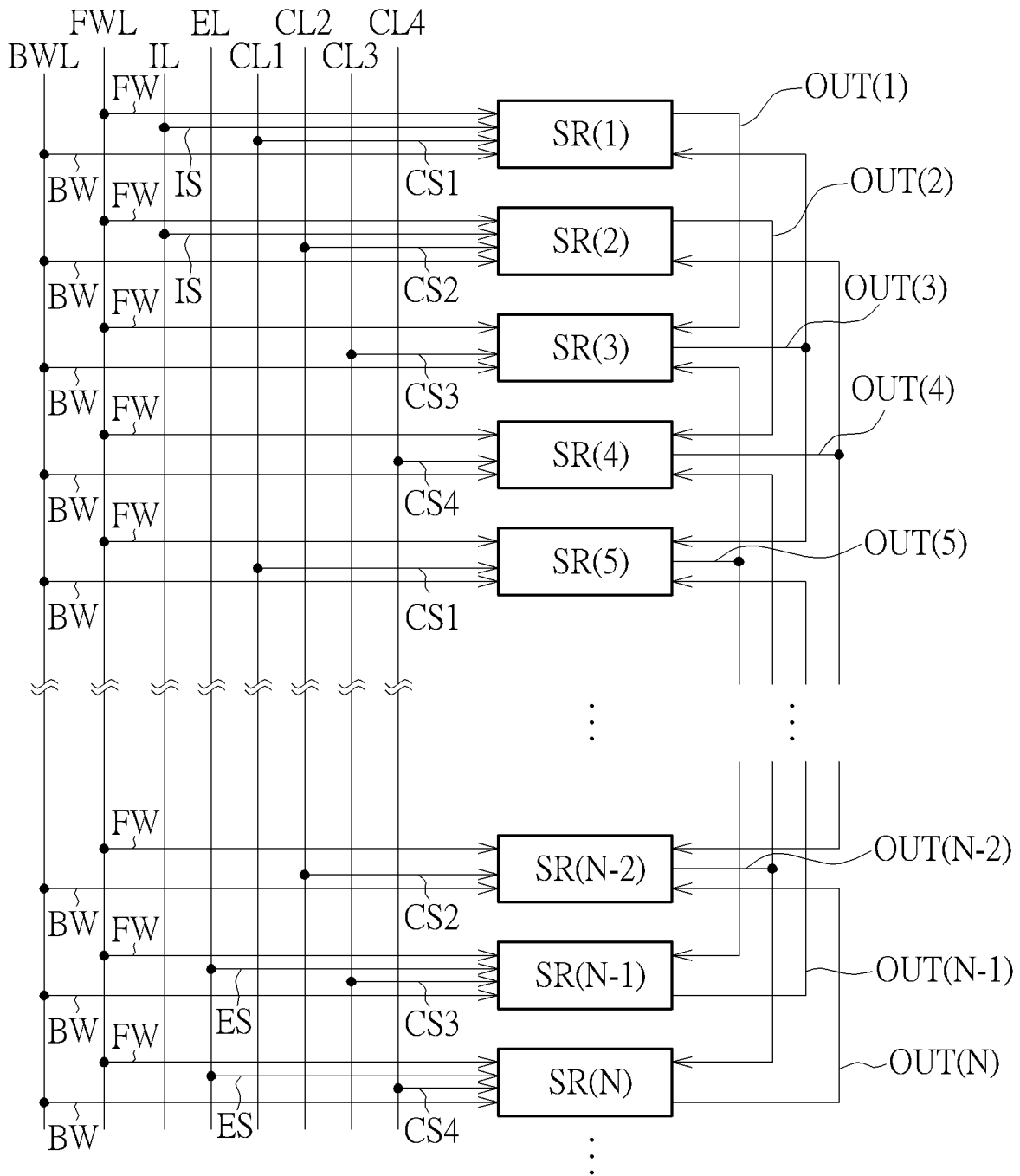
FIG. 2 is a schematic diagram illustrating a gate driving circuit according to the first embodiment of the present invention.
Figure 3:
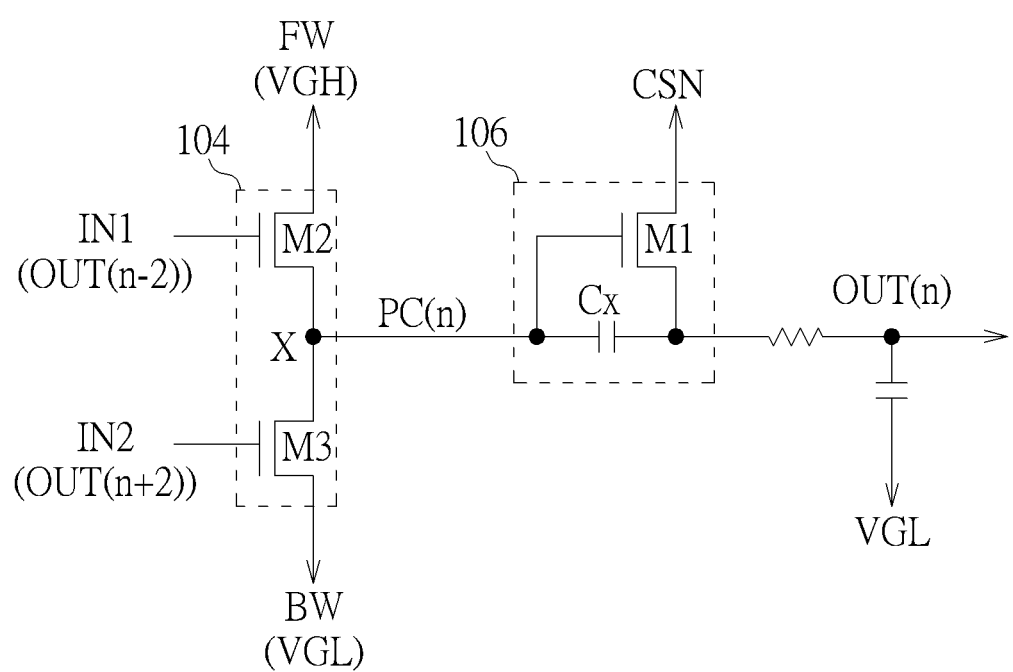
FIG. 3 is an equivalent circuit diagram of a portion of an nth-level gate driving unit in the gate driving circuit shown in FIG. 2.
Figure 4:
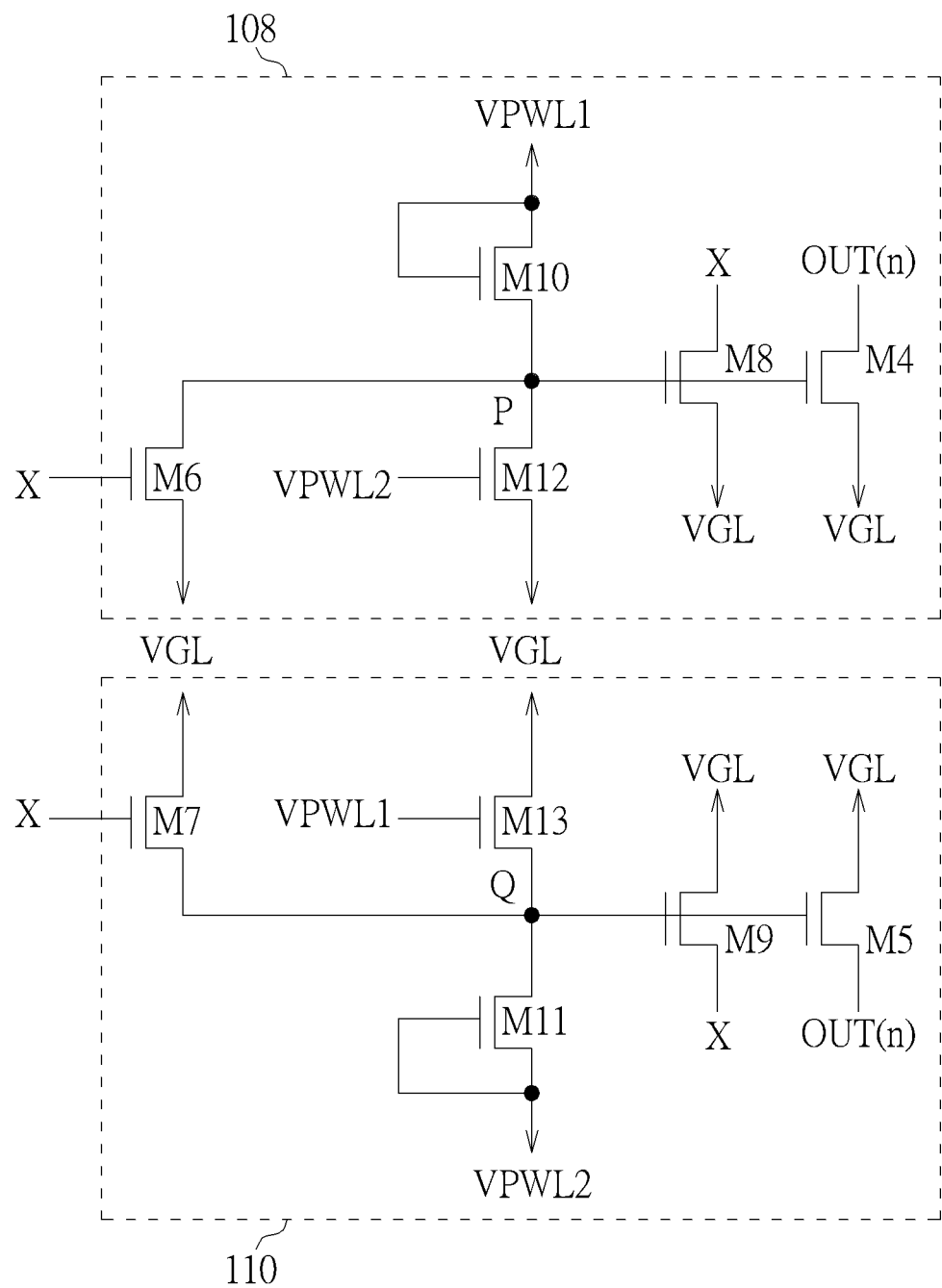
FIG. 4 is an equivalent circuit diagram of another portion of the nth-level gate driving unit in the gate driving circuit shown in FIG. 2.
Figure 5A:
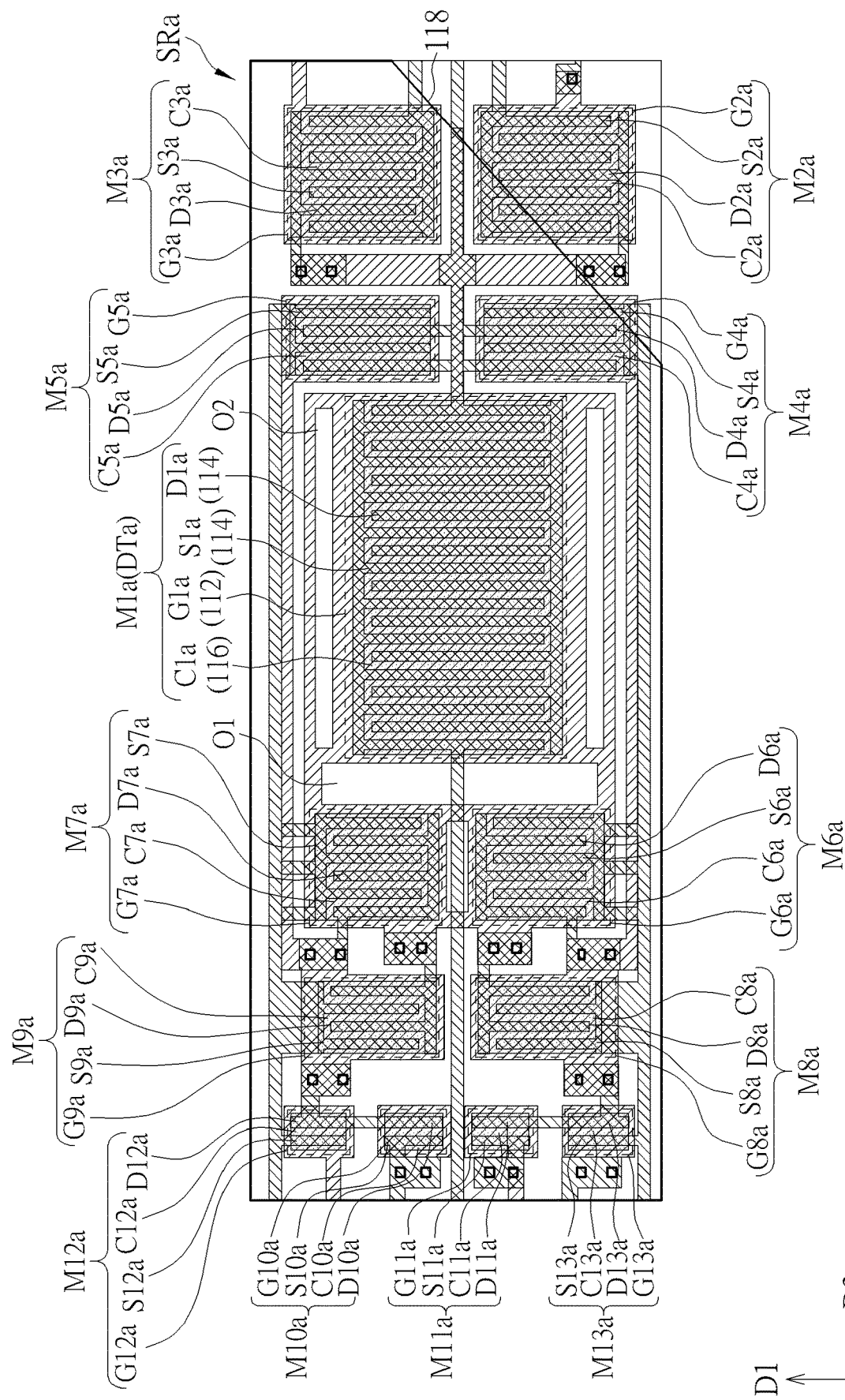
FIG. 5A is a schematic diagram illustrating a circuit layout of a first gate driving unit according to the first embodiment of the present invention.
Figure 5B:
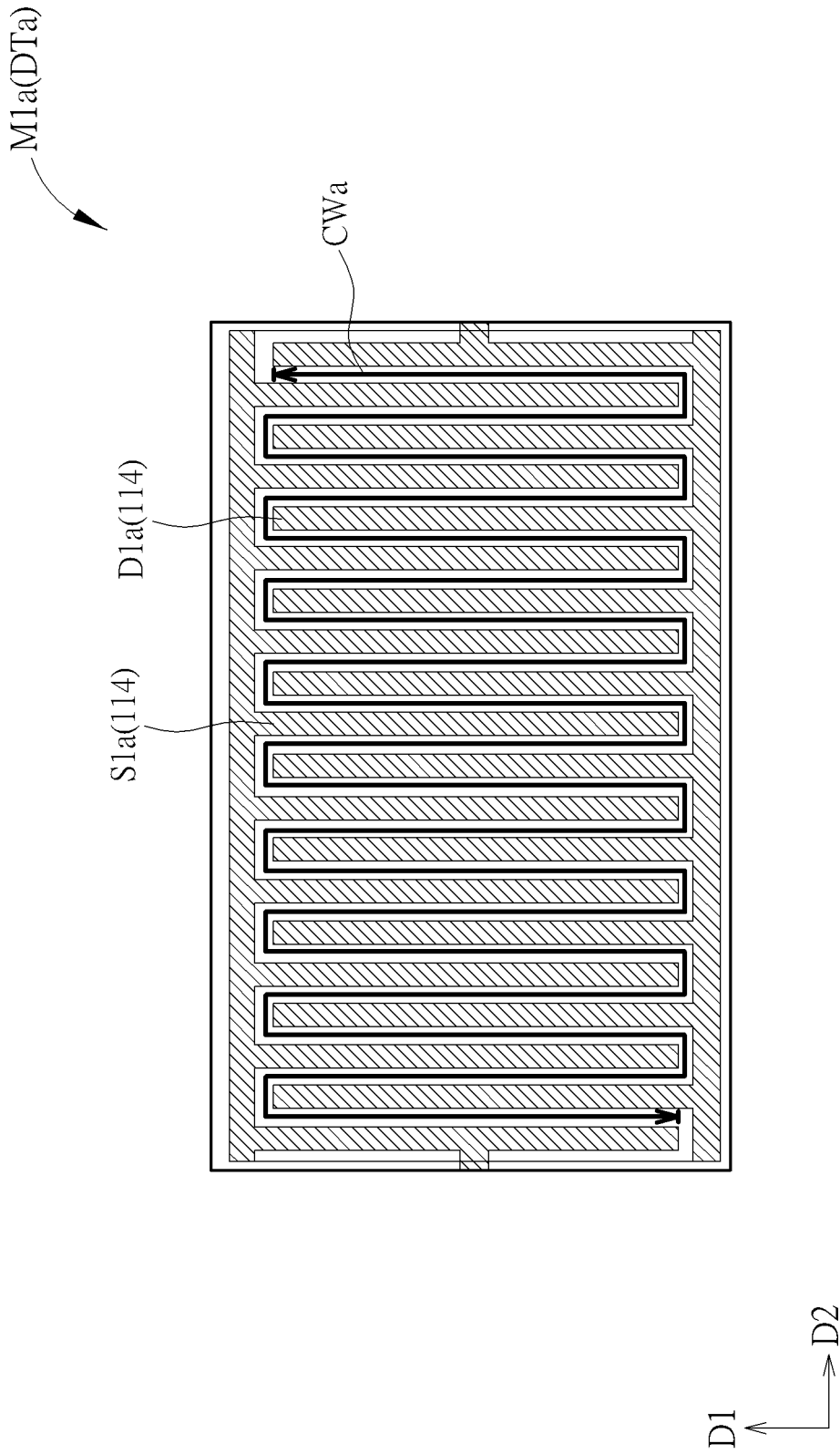
FIG. 5B is a schematic diagram illustrating a channel width of a thin film transistor of a first gate driving unit according to the first embodiment of the present invention.
Figure 6A:
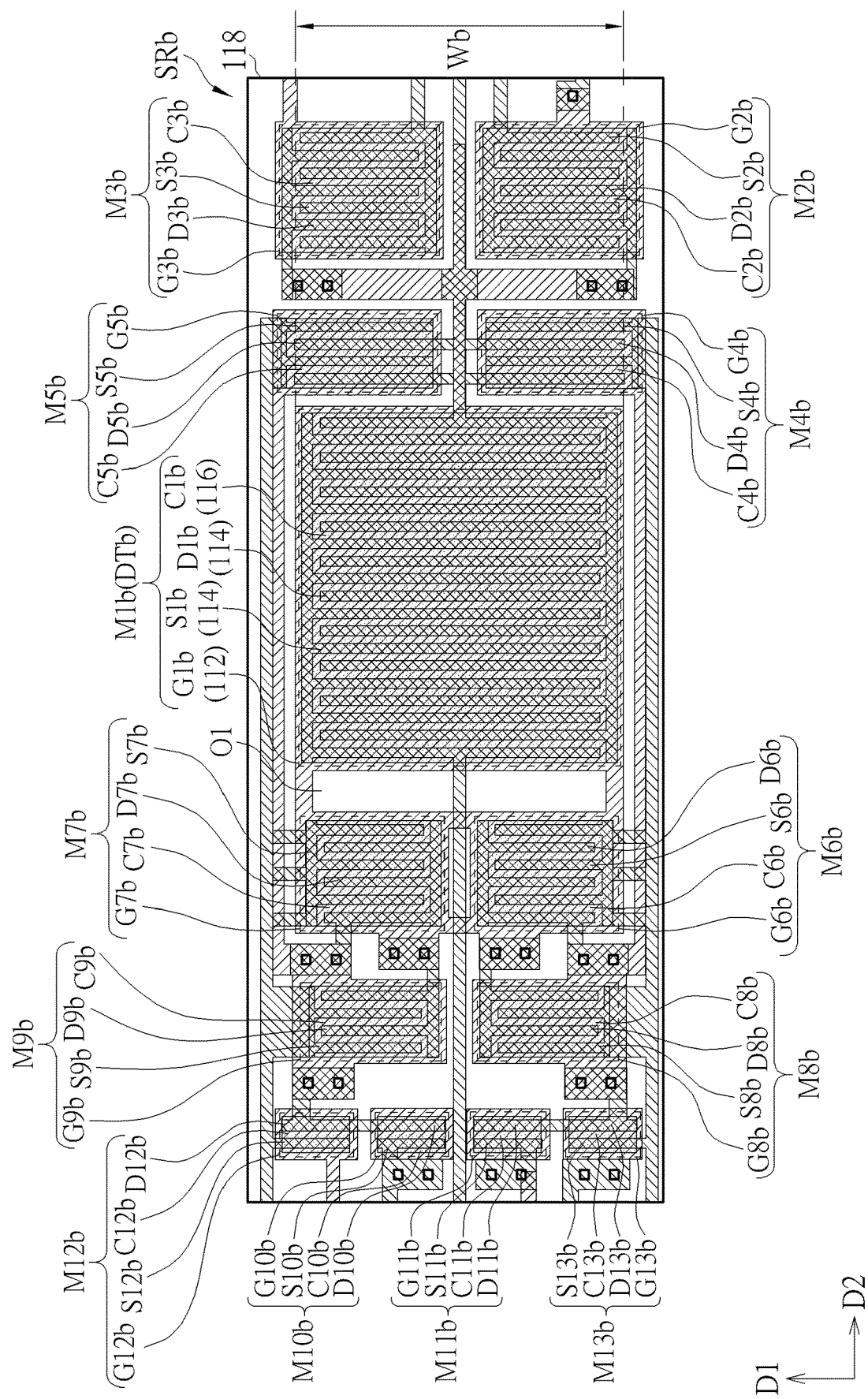
FIG. 6A is a schematic diagram illustrating a circuit layout of a second gate driving unit according to the first embodiment of the present invention.
Figure 6B:
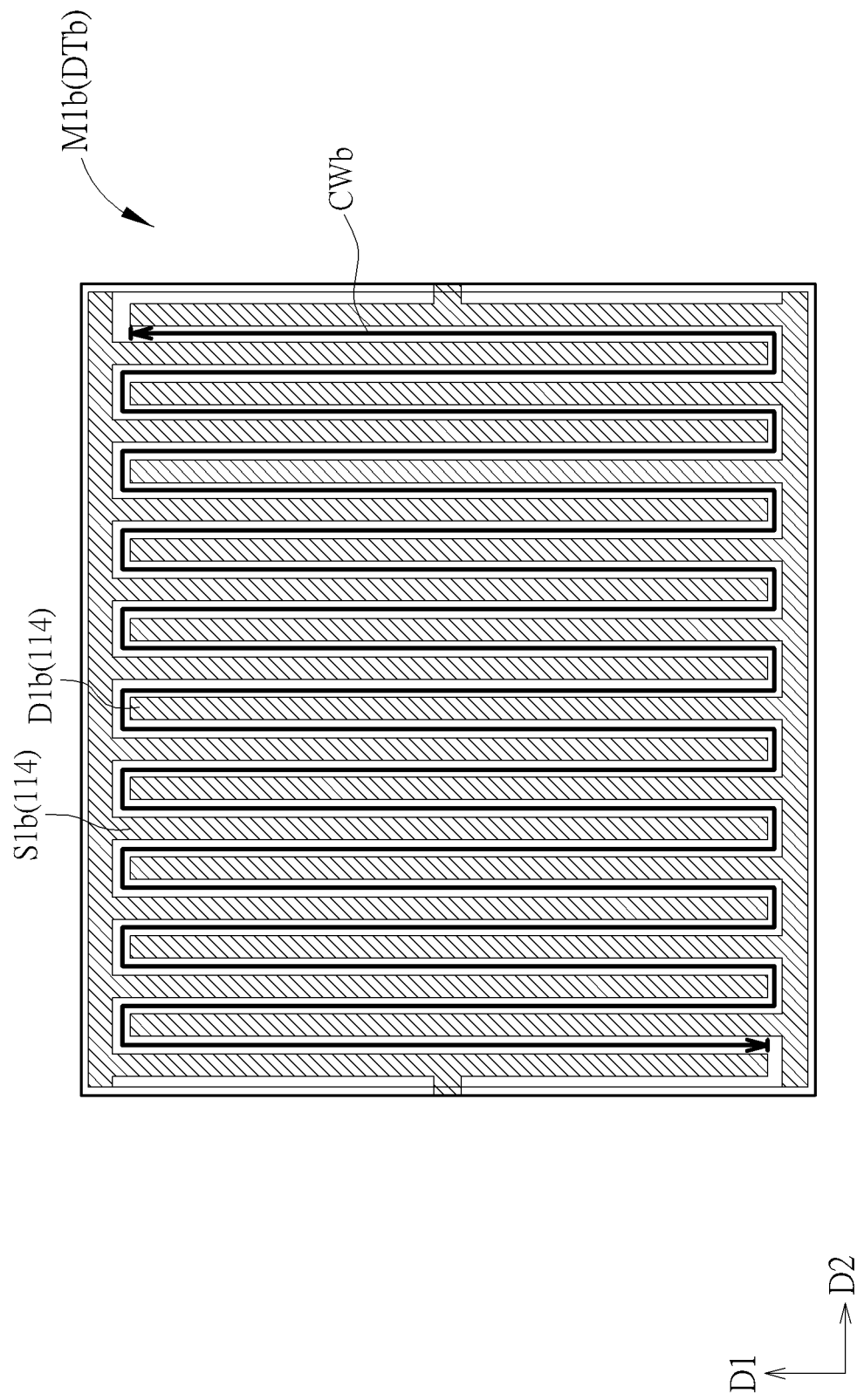
FIG. 6B is a schematic diagram illustrating a channel width of a thin film transistor of a second gate driving unit according to the first embodiment of the present invention.
Figure 7:
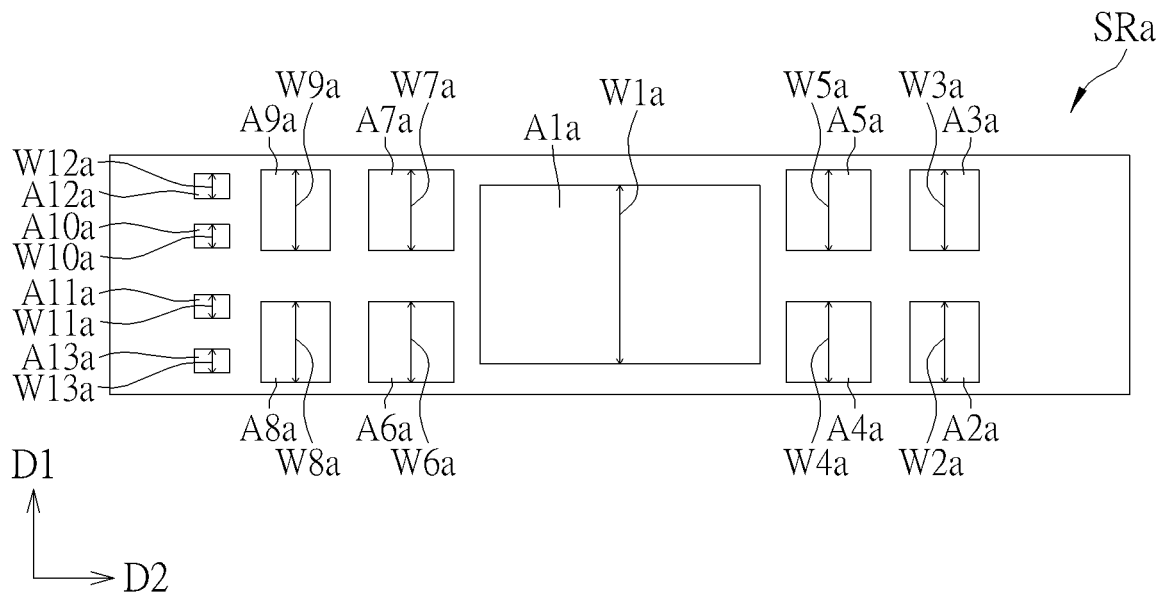
FIG. 7 is a schematic diagram illustrating a thin film transistor in the first gate driving unit shown in FIG. 5A.
Figure 8:
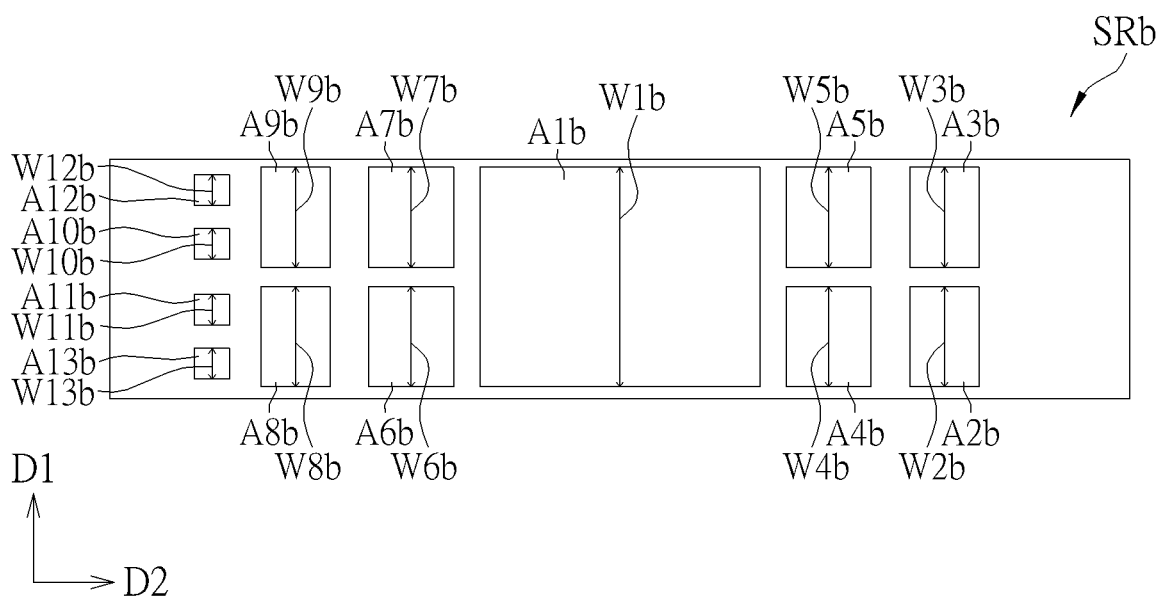
FIG. 8 is a schematic diagram illustrating a thin film transistor in the second gate driving unit shown in FIG. 6A.
Figure 9:
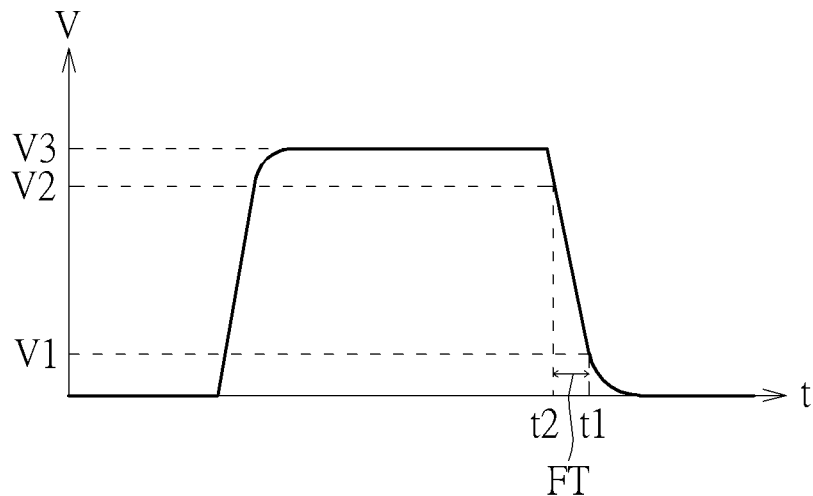
FIG. 9 is a schematic diagram illustrating a signal output waveform of the gate drive unit according to the first embodiment of the present invention.

Referring to FIG. 1 to FIG. 9, FIG. 1 is a schematic diagram illustrating a top view of a display panel according to a first embodiment of the present invention, FIG. 2 is a schematic diagram illustrating a gate driving circuit according to the first embodiment of the present invention, FIG. 3 is a portion of an equivalent circuit diagram of a nth-level gate driving unit in the gate driving circuit shown in FIG. 2, FIG. 4 is another portion of an equivalent circuit diagram of the nth-level gate driving unit in the gate driving circuit shown in FIG. 2, FIG. 5A is a schematic diagram illustrating a circuit layout of a first gate driving unit according to the first embodiment of the present invention, FIG. 5B is a schematic diagram illustrating a channel width of a thin film transistor of a first gate driving unit according to the first embodiment of the present invention, FIG. 6A is a schematic diagram illustrating a circuit layout of a second gate driving unit according to the first embodiment of the present invention, FIG. 6B is a schematic diagram illustrating a channel width of a thin film transistor of a second gate driving unit according to the first embodiment of the present invention, FIG. 7 is a schematic diagram illustrating a thin film transistor in the first gate driving unit shown in FIG. 5A, FIG. 8 is a schematic diagram illustrating a thin film transistor in the second gate driving unit shown in FIG. 6A, and FIG. 9 is a schematic diagram illustrating a signal output waveform of the gate drive unit according to the first embodiment of the present invention.

The display panel of the present invention can be various types of flat display panels, such as a liquid crystal display panel, an electrophoretic display panel, an organic light emitting display (OLED) panel, or a micro light emitting diode display (micro LED) panel, but not limited thereto. The display region of the display panel in the present invention may have different shapes, for example, it is applicable to a wearable display, but not limited thereto. As shown in FIG. 1, the substrate 100 of a display panel 10 has a surface, wherein the surface includes a display region DR and a peripheral region PR disposed on at least one side of the display region DR. In this embodiment, the peripheral region PR surrounds the display region DR, but is not limited thereto. The substrate 100 may be a hard substrate such as glass substrate, plastic substrate, quartz substrate or sapphire substrate, or may be a flexible substrate including polyimide (PI) material or polyethylene terephthalate (PET) material, but not limited thereto. The display panel 10 includes a plurality of sub pixels SP, a plurality of scan lines SL and a plurality of data lines disposed in the display region DR. In order to make the drawing more simplified and easy to understand, only a portion of the sub pixels SP and a portion of the scan lines SL in the display area DR are illustrated and the data lines are omitted. The data lines may extend generally in a first direction D1, the scan lines SL may extend generally in a second direction D2, and the first direction D1 and the second direction D2 are not parallel. In this embodiment, the first direction D1 and the second direction D2 are perpendicular, but not limited thereto. The sub pixels SP may be arranged in an array, and each of the sub pixels SP is electrically connected to one scan line SL and one data line. For example, three sub pixels SP adjacent in the second direction D2 may constitute one pixel, wherein these sub pixels SP may be electrically connected to the same scan line SL, and may be used to display different colors, such as red, blue, and green, but not limited thereto. In this embodiment, the shape of the display region DR is generally rectangular (but not limited thereto) and has two sides generally parallel to the first direction D1 and two sides generally parallel to the second direction D2. The display region DR has a notch NT, wherein the notch NT is disposed at one of the sides of the display region DR that is parallel to the second direction D2, and the display area DR has two protruding portions MP located on both sides of the notch NT in the second direction D2, but the shape of the display region of the present invention is not limited to this embodiment. As shown in FIG. 1, the display region DR includes a first area R1 and a second area R2, wherein the first area R1 includes the notch NT and the protruding portions MP, and the second area R2 is the portion of the display region DR that does not include the notch NT. Besides, the sub pixels SP includes a plurality of first sub pixels SP1 and a plurality of sub pixels SP2, the first sub pixels SP1 are disposed in the first area R1, and the second sub pixels SP2 are disposed in the second area R2, wherein the first sub pixels SP1 are disposed in the protruding portions MP. The first area R1 has a plurality of first scan lines SL1, and each of the first scan lines SL1 is electrically connected to a portion of the first sub pixels SP1. For example, each of the first scan lines SL1 is electrically connected to the first sub pixels SP1 of the corresponding sub pixel row. The second area R2 has a plurality of second scan lines SL2, and each of the second scan lines SL2 is electrically connected to a portion of the second sub pixels SP2. For example, each of the second scan lines SL2 is electrically connected to the second sub pixels SP2 of the corresponding sub pixel row. In the first area R1, since the first sub pixels SP1 are disposed in the protruding portions MP and are not disposed in the notch NT, the number of first sub pixels SP1 in the first area R1 is less than the number of second sub pixels SP2 in the second area R2, and the number of the first sub pixels SP1 electrically connected to each of the first scan lines SL1 is less than the number of the second sub pixels SP2 electrically connected to each of the second scan lines SL2. In other words, the number of the first sub pixels SP1 driven by each of the first scan lines SL1 is less than the number of the second sub pixels SP2 driven by each of the second scan lines SL2.

The display panel 10 may include at least one gate driving circuit 102 disposed in the peripheral region PR, wherein the gate driving circuit 102 is disposed at one side of the display region DR in the second direction D2. The gate driving circuit 102 may be electrically connected to the scan line SL, and may transmit a scanning signal to the scan line SL, so as to drive the sub pixels SP in the display region DR. Besides, the gate driving circuit 102 may be electrically connected to at least one controlling integrated circuit IC, and the controlling integrated circuit may transmit a controlling signal (such as a clock signal, initial signal and ending signal) to the gate driving circuit 102. The controlling integrated circuit may be disposed in the peripheral region PR, but is not limited thereto. In this embodiment, the display panel 10 may include two gate driving circuits 1021, 1022 respectively disposed at both sides of the display region DR in the second direction D2, but not limited thereto. As shown in FIG. 1, for the adjacent two first scan lines SL1, one of the first scan lines SL1 may be electrically connected to the gate driving circuit 1021, and another first scan line SL1 may be electrically connected to the gate driving circuit 1022. Similarly, for the adjacent two second scan lines SL2, one of the second scan lines SL2 may be electrically connected to the gate driving circuit 1021, and another second scan line SL2 may be electrically connected to the gate driving circuit 1022. The resolution of the display panel 10 in this embodiment may be 720×1512, and the display panel 10 may include 1512 scan lines SL, wherein the scan lines SL includes 72 first scan lines SL1 and 1440 second scan lines. For example, the gate driving circuit 1021 may be electrically connected to 36 first scan lines SL1 and 720 second scan lines SL2, and the gate driving circuit 1022 may be electrically connected to another 36 first scan lines SL1 and 720 second scan lines SL2, but this is not limited thereto. The circuit structures of the gate driving circuits 1021, 1022 are gate driver on array (GOA), but not limited thereto. The components in the gate driving circuit 102 and their structures will be described below in detail.

As shown in FIG. 2, the gate driving circuit 102 in this embodiment includes clock signal lines CL1 to CL4, an initial signal line IL, an ending signal line EL, a forward input signal line FWL, a backward input signal line BWL and a first-level gate driving unit SR(1) to a nth-level gate driving unit SR(N), wherein N is a positive integer greater than or equal to 5, but not limited thereto. The gate driving unit SR in this embodiment may be a shift register, but is not limited thereto. The clock signal lines CL1 to CL4 provide the clock signals CS1-CS4 to the corresponding gate driving units SR(1)-SR(N). The first-level gate driving unit SR(1) to the nth-level gate driving unit SR(N) may be the gate driver on array (GOA) circuit structure. Furthermore, N may be a multiple of 4, and the clock signal lines CL1 provides the clock signal CS1 to the first-level gate driving unit SR(1), the fifth-level gate driving unit SR(5) . . . and the (N−3)th-level gate driving unit SR(N−3), the clock signal lines CL2 provides clock signal CS2 to the second gate driving unit SR(2), the sixth gate driving unit SR(6) . . . and the (N−2)th-level gate driving unit SR(N−2), the clock signal line CL3 provides clock signal CS3 to the third-level gate driving unit SR(3), the seventh-level gate driving unit SR(7) . . . and the (N−1)th-level gate driving unit SR(N−1), and the clock signal line CL4 provides clock signal CS4 to the fourth-level gate driving unit SR(4), the eighth-level gate driving unit SR(8) . . . and the Nth-level gate driving unit SR(N). Furthermore, the forward input signal line FWL and the backward signal line BWL respectively provide forward input signals FW and backward input signals BW to the first-level gate driving unit SR(1) to the Nth-level gate driving unit SR(N). The initial signal line IL provides initial signals IS to the first-level gate driving unit SR(1) and the second-level gate driving unit SR(2), and the ending signal line EL provides ending signals ES to the (N−1)th-level gate driving unit SR(N−1) to the Nth-level gate driving unit SR(N). The clock signal lines CL1-CL4, the initial signal line IL, the ending signal line EL, the forward input signal line FWL and the backward input signal line BWL may be coupled to one or more than one chip. That is, the clock signals CS1-CS4, the initial signal IS, the ending signal ES, the forward input signal line FWL and the backward input signal line BWL may be provided by this one or more than one chip, such as a driving chip and/or a timing control chips and so on, but not limited thereto.

In addition, the first-level gate driving unit SR(1) to the Nth-level gate driving unit SR(N) respectively produce a first-level scanning signal OUT(1) to a Nth-level scanning signal OUT(N), and the scanning signals OUT(1)-OUT(N) may be respectively output to the corresponding scan lines SL in FIG. 1, and the sub pixels SP electrically connected to the gate driving units are driven through the scan lines SL. Wherein, the first-level scanning signal OUT(1) and the second-level scanning signal OUT(2) are respectively input to the third-level gate driving unit SR(3) and the fourth-level gate driving unit SR(4), the (N−1)th-level scanning signal OUT(N−1) and the (N)th-level scanning signal OUT(N) are respectively input to the (N−3)th-level gate driving unit SR(N−3) and the (N−2)th-level gate driving unit SR(N−2), and each of the scanning signals from the third-level scanning signal OUT(3) to the (N−2)th-level scanning signal OUT(N−2) is input to the gate driving unit two levels greater than or two levels less than its own level. For example, the third-level scanning signal OUT(3) is input to the first-level gate driving unit SR(1) and the fifth-level gate driving unit SR(5).

As shown in FIG. 3, the nth-level (wherein n is a positive integer from 1 to N) gate driving unit SR(n) includes a precharge unit 104 and a pull-up unit 106, wherein the precharge unit 104 and one end of the pull-up unit 106 are coupled to a node X (which corresponds to a precharge signal PC(n)), and another end of the pull-up unit 106 outputs the nth-level scanning signal OUT(n) to the corresponding scan line SL. The precharge unit 104 receives input signals IN1, IN2, and the precharge signal PC(n) is output to the node X. The precharge unit 104 includes thin film transistors M2, M3. In this embodiment, the gate driving circuit 102 is a dual directional scanning driving circuit, and in the gate driving units SR(1)-SR(N), a control end of the thin film transistor M2 receives the input signal IN1, a first end of the thin film transistor M2 receives the forward input signal FW, and a second end of the thin film transistor M2 is coupled to the node X. A control end of the thin film transistor M3 receives the input signal IN2, a first end of the thin film transistor M3 receives the backward input signal BW, and a second end of the thin film transistor M3 is coupled to a second end of the second thin film transistor M2, wherein the forward input signal FW and the backward input signal BW are inverted to each other when the display panel are displaying, that is, when one of the forward input signal FW and the backward input signal BW has a high electric potential, then another one would have a low electric potential. Besides, in the embodiment that the gate driving circuit 102 is a single directional scanning driving circuit, the first end of the thin film transistor M2 receives a high electric potential, and the first end of the thin film transistor M3 receives a low electric potential. For the gate driving circuit as shown in FIG. 2, the forward input signal line FWL and the backward input signal line BWL may respectively be replaced by a high electric potential line and a low electric potential line, and the remaining portion is similar to the above description. For example, the high electric potential may be a gate high voltage (VGH), and the low electric potential may be a gate low voltage (VGL). In this invention, the "control end", "first end" and "second end" of the thin film transistor may respectively mean the gate electrode, the source electrode and the drain electrode of a thin film transistor, or may respectively mean the gate electrode, the drain electrode and the source electrode of a thin film transistor.

If a gate driving unit SR(n) is a first-level gate driving unit or a second-level gate driving unit (that is, n is 1 or 2), then the input signal IN1 is an initial signal IS, and the input signal IN2 is a scanning signal OUT(n+2) output by the (n+2)th-level gate driving unit SR(n+2) (that is, the third-level scanning signal OUT(3) or the fourth-level scanning signal OUT(4)). If the gate driving unit SR(n) is any one of the gate driving unit from the third-level gate driving unit to the (N−2)th-level gate driving unit (that is, n is any one of integers from 3 to (N−2)), then the input signals IN1, IN2 are respectively the (n−2)th-level scanning signal OUT(n−2) output by the (n−2)th-level gate driving unit SR(n−2) and the (n+2)th-level scanning signal OUT(n−2) output by the (n+2)th-level gate driving unit SR(n+2). If the gate driving unit SR(n) is a (N−1)th-level gate driving unit or a (N)th-level gate driving unit (that is, n is (N−1) or N), then the input signal IN1 is the scanning signal OUT(n−2) output by the (n−2)th-level gate driving unit SR(n−2) (that is, the (N−3)th-level scanning signal OUT(N−3) or the (N−2)th-level scanning signal (N−2)), and the input signal IN2 is the ending signal ES. It should be noted that, when the gate driving circuit 102 is in forward scanning mode, i.e., when the forward input signal FW has high electric potential and the backward input signal BW has low electric signal, IS is the initial signal and ES is the ending signal; when the gate driving circuit 102 is in backward scanning mode, i.e., when the forward input signal FW has low electric potential and the backward input signal BW has high electric signal, ES is the initial signal and IS is the ending signal.

The pull-up unit 106 is coupled to the precharge unit 104, wherein the pull-up unit 106 receives a precharge signal PC(n) and a clock signal CSN, and the scanning signal OUT(n) is output according to the precharge signal PC(n) and the clock signal CSN, wherein the clock signal CSN is any one of the clock signals CS1-CS4. In the embodiment where N is a multiple of 4, if n is 1, 5, . . . (N−3), then the clock signal CSN is the clock signal CS1; if n is 2, 6, . . . (N−2), then the clock signal CSN is the clock signal CS2; if n is 3, 7, . . . (N−1), then the clock signal (N−1) is the clock signal CS3, if n is 4, 8, . . . N, then the clock signal N is the clock signal CS4. The pull-up unit 106 includes a thin film transistor M1 and a capacitance Cx. A control end of the thin film transistor M1 receives the precharge signal PC(n), a first end of the thin film transistor M1 receives the clock signal CSN, and a second end of the thin film transistor M1 outputs the scanning signal OUT(n). A first end of the capacitance Cx is coupled to the control end of the thin film transistor M1, and a second end of the capacitance Cx is coupled to the second end of the thin film transistor M1.

As shown in FIG. 4, the nth-level shift register SR(n) in this embodiment further includes a first pull-down unit 108 and a second pull-down unit 110, wherein one end of the precharge unit 104, the pull-up unit 106, the first pull-down unit 108, and the second pull-down unit 110 are coupled to the node X (which corresponds to the precharge signal PC(n)), and another end of the pull-up unit 106, the first pull-down unit 108, and the second pull-down unit 110 output the nth-level scanning signal OUT(n) to the corresponding scan lines SL. The first pull-down unit 108 is coupled to the precharge unit 104 and the pull-up unit 106, which receives the precharge signal PC(n) and the pull-down controlling signals VPWL1, VPWL2, and the scanning signal OUT(n) may be pulled down and maintained at a reference potential according to the precharge signal PC(n) and the pull-down controlling signals VPWL1, VPWL2. As shown in FIG. 4, the reference potential in this embodiment is a gate low voltage (VGL), but this is not limited thereto. In a frame time, the pull-down controlling signals VPWL1, VPWL2 are inverted to each other, that is, one of the pull-down controlling signals VPWL1, VPWL2 has a high electric potential and another one has a low electric potential. The first pull-down unit 108 includes thin film transistors M4, M6, M8, M10 and M12. The pull-down controlling signal VPWL1 is input to a control end and a first end of the thin film transistor M10. The pull-down controlling signal VPWL2 is input to a control end of the thin film transistor M12, a first end of the thin film transistor M12 is coupled to a reference potential VGL, a second end of the thin film transistor M12 is coupled to a second end of the thin film transistor M10, and the second end of the thin film transistor M12 and the second end of the thin film transistor M10 are coupled to a node P. A control end of the thin film transistor M6 is coupled to the node X, a first end of the thin film transistor M6 is coupled to the reference potential VGL, and a second end of the thin film transistor M6 is coupled to a second end of the thin film transistor M10. A control end of the thin film transistor M8 is coupled to the second end of the thin film transistor M6, the first end of the thin film transistor M8 is coupled to the reference potential VGL, and the second end of the thin film transistor M8 is coupled to the node X. A control end of the thin film transistor M4 is coupled to the second end of the thin film transistor M6, a first end of the thin film transistor M4 is coupled to the reference potential VGL, and a second end of the thin film transistor M4 is coupled to the scanning signal OUT(n).

After the shift register SR(n) outputs the scanning signal OUT(n) to initiate corresponding pixel columns, i.e. after the scanning signal OUT(n) is raised to a high electric potential, maintained for a while and then reduced to the low electric potential, the electric potential of the node X is reduced from the high electric potential to the low electric potential, and the first pull-down unit 108 starts action. When the pull-down controlling signal VPWL1 is at a low electric potential and the pull-down controlling signal VPWL2 is at a high electric potential, a node P is at a low electric potential state, such that the thin film transistors M4 and M8 are closed; and when the pull-down controlling signal VPWL1 is at a high electric potential and the pull-down controlling signal VPWL2 is at a low electric potential, the node P is at a high electric potential state, such that the thin film transistors M4 and M8 are turned on, and the electric potential of the node X is set to be the reference potential VGL. In one frame time, after the shift register SR(n) outputs scanning signal OUT(n) to initiate corresponding pixel columns, i.e. after the scanning signal OUT (n) is raised to a high electric potential, maintained for a while and then reduced to a low electric potential, if a noise signal is coupled to node X and therefore the electric potential of the node X has a ripple, the thin film transistors M4 and M8 that are turned on would pull down the electric potential of the node X to a low electric potential (such as the reference potential VGL), or would pull down the electric potential of the scanning signal OUT(n) to a low electric potential and maintain at the low electric potential, and the scanning signal OUT(n) would not be disturbed by noise.

The second pull-down unit 110 is coupled to the precharge unit 104 and the pull-up unit 106, which receives precharge signal PC(n) and pull-down controlling signal VPWL1, VPWL2. The scanning signal OUT(n) may be pulled down to a reference potential VGL and maintained at the reference potential VGL according to the precharge signal PC(n) and the pull-down controlling signals VPWL1, VPWL2. The second pull-down unit 110 includes thin film transistors M5, M7, M9, M11 and M13. The pull-down controlling signal VPWL2 is input to a control end and a first end of the thin film transistor M11. The pull-down controlling signal VPWL1 is input to a control end of the thin film transistor M13, a first end of the thin film transistor M13 is coupled to the reference potential VGL, a second end of the thin film transistor M13 is coupled to a second end of the thin film transistor M11, and a second end of the thin film transistor M11 and a second end of the thin film transistor M13 are coupled to a node Q. A control end of the thin film transistor M7 is coupled to the node X, a first end of the thin film transistor M7 is coupled to the reference potential VGL, and a second end of the thin film transistor M7 is coupled to a second end of the thin film transistor M11. A control end of the thin film transistor M9 is coupled to the second end of the thin film transistor M7, a first end of the thin film transistor M9 is coupled to the reference potential VGL, and a second end of the thin film transistor M9 is coupled to the node X. A control end of the thin film transistor M5 is coupled to the second end of the thin film transistor M7, a first end of the thin film transistor M5 is coupled to the reference potential VGL, and a second end of the thin film transistor M5 is coupled to the scanning signal OUT(n).

After the shift register SR(n) outputs scanning signal OUT(n) to initiate corresponding pixel columns, i.e. after the scanning signal OUT(n) is raised to a high electric potential, maintained for a while and then reduced to a low electric potential, the electric potential of the node X is reduced from the high electric potential to the low electric potential, and the second pull-down unit 110 starts action. When the pull-down controlling signal VPWL1 is at a low electric potential and the pull-down controlling signal VPWL2 is at a high electric potential, the node Q is at a high electric potential state, such that the thin film transistors M9 and M5 are turned on, such that the electric potential of the node X is set to be the reference potential VGL; when the pull-down controlling signal VPWL1 is at a high electric potential and the pull-down controlling signal VPWL2 is at a low electric potential, the node Q is at a low electric potential state, such that the thin film transistors M9 and M5 are closed. In one frame time, after the shift register SR(n) outputs scanning signal OUT(n) to initiate corresponding pixel columns, i.e. after the scanning signal OUT(n) is raised to a high electric potential, maintained for a while and then reduced to a low electric potential, if a noise signal is coupled to node X, the thin film transistors M9 and M5 that are turned on would pull down the electric potential of the node X to a low electric potential, or would pull down the electric potential of the scanning signal OUT(n) to a low electric potential and maintain at the low electric potential, and the scanning signal OUT(n) would not be disturbed by noise.

The circuit layout of the gate driving units shown in FIG. 5A and FIG. 6A correspond to the equivalent circuits in FIG. 3, FIG. 4 and the above description. In order to simplify the drawing, FIG. 5A and FIG. 6A only show a first conductive layer 112, a second conductive layer 114, a semiconductor layer 116, and a sealant 118. In FIG. 5A and FIG. 6, the range of the sealant 118 in a partial area is indicated by a thick solid line, however, the range of the sealant 118 in the peripheral region PR is not limited thereto, and may extend along the edge of the display panel 10. In this embodiment, the first conductive layer 112 is disposed between the second conductive layer 114 and the substrate 100, the semiconductor layer 116 is disposed between the first conductive layer 112 and the second conductive layer 114, and the sealant 118 is disposed on the second conductive layer 114, but not limited thereto.

The gate driving unit SR includes a plurality of first gate driving units SRa (as shown in FIG. 5A) and a plurality of second gate driving units SRb (shown in FIG. 6), wherein each of the first gate driving units SRa is electrically connected to one first scan line SL1 in the first area R1, and each of the second gate drive units SRb is electrically connected to one second scan line SL2 in the second area R2. In other words, the first sub pixels SP1 electrically connected to the corresponding first scan line SL1 are driven by the corresponding first gate driving unit SRa through this first scan line SL1, and the second sub pixels SP2 electrically connected to the corresponding second scan line SL2 are driven by the corresponding second gate driving unit SRb through this second scan line SL2.

Each of the gate driving units SR includes thirteen thin film transistors, but the number of the thin film transistors is not limited thereto. For example, each of the first gate driving units SRa includes thin film transistors M1a to M13a, and each of the second gate driving units SRb includes thin film transistors M1b to M13b. As shown in FIG. 5A and FIG. 6A, the arrangement of the thin film transistors M1a-M13a in each of the first gate driving units SRa may be the same as the arrangement of the thin film transistors M1b-M13b in each of the second gate driving units SRb, but not limited thereto. Each of the thin film transistors includes a gate electrode, a source electrode, a drain electrode and a patterned semiconductor layer. As shown in FIG. 5A, in the thin film transistors M1a-M13a, the gate electrodes G1a-G13a are formed by the first conductive layer 112, the source electrodes S1a-S13a and the drain electrodes D1a-D13a are formed by the second conductive layer 114, and the patterned semiconductor layers C1a-C13a are formed by the semiconductor layer 116. Similarly, in the thin film transistors M1b-M13b in FIG. 6, the gate electrodes G1b-G13b are formed by the first conductive layer 112, the source electrodes S1b-S13b and the drain electrode D1b-D13b are formed by the second conductive layer 114, and the patterned semiconductor layer C1b-C13b is formed by the semiconductor layer 116. The first conductor layer 112 and the second conductive layer 114 may be metal materials, but not limited thereto. The semiconductor layer 116 may be amorphous silicon, but is not limited thereto.

FIG. 7 illustrates the areas A1a-A13a of the thin film transistors M1a-M13a in the first gate driving unit SRa in FIG. 5A, and FIG. 8 illustrates the areas A1b-A13b of the thin film transistor M1b-M13b in the second gate driving unit SRb in FIG. 6A. FIG. 5B and FIG. 6B illustrate the channel widths CWa, CWb of the thin film transistors M1a, M1b in FIG. 5A, FIG. 6A, where the channel widths CWa, CWb may be the length of the winding path between the source electrode S1a, S1b and the drain electrode D1a, D1b. It should be noted that the area of each thin film transistor may also be used to indicate the channel width of each thin film transistor. The larger the area of each thin film transistor, the longer the channel width of each thin film transistor may be.

As shown in FIG. 5A, FIG. 6A, FIG. 7 and FIG. 8, in this embodiment, the area of each of the thin film transistors in the first gate driving unit SRa is less than the area of each of the corresponding thin film transistors in the second gate driving unit SRb. In other words, the channel width of each of the thin film transistors in the first gate driving unit SRa is less than the channel width of each of the corresponding thin film transistors in the second gate driving unit SRb. For example, the channel CWa of the thin film transistor M1a is less than the channel width CWb of the thin film transistor M1b (as shown in FIG. 5B and FIG. 6B), and the channel widths of the rest of the thin film transistors M2a-M13a are also less than corresponding channel widths of the thin film transistors M2b-M13b. In addition, the area A1a of the thin film transistor M1a is less than the area A1b of the thin film transistor M1b, and the areas A2a-A13a of the rest of the thin film transistors M2a-M13a are also less than or equal to the areas A2b-A13b of the corresponding thin film transistors M2b-M13b.

As shown in FIG. 5 to FIG. 7, taking the thin film transistor M1a of this embodiment as an example, the area A1a may be defined as the area of the gate G1a or the area of the patterned semiconductor layer C1a, but not limited thereto. The source electrode S1a and the drain electrode D1a of this embodiment have a grid structure, wherein the grid structure has a main electrode and a plurality of branch electrodes connected to the main electrode, and the branch electrodes of the two grid structures are alternately arranged to each other such that the source electrode S1a and the drain electrode D1a form an integrated structure, and the area A1a of the thin film transistor M1a may also be defined as the area of the integrated structure of the source electrode S1a and the drain electrode D1a. The reduction of the area of the source electrode S1a and the drain electrode D1a may also be considered as the reduction of the channel width CWa of the thin film transistor M1a.

According to the present invention, no matter which method is used to define the area or the channel width of the thin film transistor, the same definition should be used to represent the area or the channel width of each of the thin film transistors in the first gate driving unit SRa and the second gate driving unit SRb. That is, when comparing the area or the channel width of the thin film transistors in the first gate driving unit SRa and the second gate driving unit SRb, the same definition should be used for these areas or channel widths.

When the area A1a or the channel width CWa of the thin film transistor M1b is less than the area A1b or the channel width CWb of the thin film transistor M1b, the operating current of the thin film transistor M1a may be less than the operating current of the thin film transistor M1b, but this is not limited thereto. Besides, in this embodiment, a width W1a of the thin film transistor M1a in the first direction D1 is less than a width W1b of the thin film transistor M1b in the first direction D1, thereby making the area A1a less than the area A1b, and making the channel width CWa of the thin film transistor M1a less than the channel width CWb of the thin film transistor M1b. In other embodiments, the width of the thin film transistor M1a in the second direction D2 may also be less than the width of the thin film transistor M1b in the second direction D2.

Taking the thin film transistor M1a of this embodiment as an example, the width W1a may be, for example, the width of the gate G1a in the first direction D1 or the width of the patterned semiconductor layer C1a in the first direction D1, but not limited thereto. The width W1a may also be the distance from the main electrode of the source electrode S1a to the main electrode of the drain electrode D1a in the first direction D1. In addition, the above description for the thin film transistors M1a, M1b may also be applied to the rest of the thin film transistors M2a-Ml3a in the first gate driving unit SRa and the rest of the thin film transistors M2b-Ml3b in the second gate driving unit SRb.

The magnitude of driving power of the gate driving unit SR is mainly affected by the size of the channel width or the area of the thin film transistor M1, wherein the driving power indicates the strength of the output signal of the gate driving unit SR, such as the magnitude of the signal current, the level of the signal voltage, and so on. Therefore, in this embodiment, the thin film transistor M1a in each of the first gate driving units SRa is defined as a first driving transistor DTa, and the thin film transistor M1b in each of the second gate driving units SRb is defined as a second driving transistor DTb, wherein the area A1a or the channel width CWa of the first driving transistor DTa is respectively less than the area A1b or the channel width CWb of the second driving transistor DTb. Since the shape of the first area R1 in the display region DR in this embodiment includes a notch NT, the number of the first sub pixels SP1 electrically connected to each of the first scan lines SL1 is less than the number of the second sub pixels SP2 electrically connected to each of the second scan lines SL2, such that the RC loading when the signal is transmitting in the first scan line SL1 is different from the RC loading when the signal is transmitting in the second scan line SL2. For example, the RC loading of the first scan line SL1 is less than the RC loading of the second scan line SL2. Therefore, when the first gate driving unit SRa and the second gate driving unit SRb have the same driving power (for example, the first driving transistor DTa and the second driving transistor DTb have the same area or channel width), the gray level of the sub pixels in the first region R1 and the second region R2 will not be consistent, and the display panel 10 may further have a problem of uneven brightness in the first region R1 and the second region R2.

However, in this embodiment, the area A1a or the channel width CWa of the first driving transistor DTa is reduced according to the lower RC loading of the first scan line SL1, such that the driving power of the first gate driving unit SRa may be reduced, the driving power of each of the first gate driving units SRa may match the RC loading of the corresponding first scan line SL1, and the transmission quality of the scanning signal in the first region R1 and the second region R2 may be consistent, so as to improve the above problem.

In addition, the signal output waveform corresponding to each gate driving units SR can be obtained through simulation or measurement, and the signal output waveform may be as shown in FIG. 9. FIG. 9 is a waveform diagram of voltage V versus time t, wherein the value of the voltage V1 is 20% of the signal-maximum voltage V3, time t1 is the time when the signal has voltage V1, the value of the voltage V2 is 80% of the signal-maximum voltage V3, and time t2 is the time when the signal has voltage V2. The portion where the waveform descends from the voltage V2 to the voltage V1 is defined as a descending portion, the time for the waveform to descend from voltage V2 to voltage V1 is defined as a descending time FT, and the descending time FT is equivalent to the difference between time t1 and time t2. The descending time FT may also be used to represent the slope of the descending portion of the waveform.

Furthermore, the first gate driving unit SRa has a corresponding first signal output waveform, and the second gate driving unit SRb has a corresponding second signal output waveform. For example, the channel width CWa of the first driving transistor DTa of one of the first gate driving units SRa in this embodiment is 1350 micrometers ($\mu m$), and the channel width CWb of the second driving transistor DTb of one of the second gate driving units SRb is 2436 $\mu m$. In a first signal output waveform of the first gate driving unit SRa and a second signal output waveform of the second gate driving unit SRb, the descending time of the first signal output waveform is 0.955 microseconds ($\mu s$), and the descending time of the second signal output waveform is 0.956 $\mu s$, wherein the difference between the two ((0.956−0.955)/0.956) is about 0.1%. Since the descending time FT can also be used to indicate the slope of the descending portion of the waveform, the difference between the slope of the descending portion of the first signal output waveform and the slope of the descending portion of the second signal output waveform is also about 0.1%. Therefore, in this embodiment, the difference between the descending time of the first signal output waveform and the descending time of the second signal output waveform may be less than or equal to 2%, and the difference between the slope of the descending portion of the first signal output waveform and the slope of the descending portion of the second signal output waveform is less than or equal to 2%.

Accordingly, the problem that the gray levels in the sub pixels SP of the first area R1 and the second R2 are not consistent may be improved, and the problem of uneven brightness in the first area and the second area is improved.

Besides, in this embodiment, the area A1a or the channel width CWa of the first driving transistor DTa of each of the first gate driving units SRa may be modified according to the corresponding RC loading, such that the first gate driving units SRa may have different areas A1a or channel widths CWa. For example, the channel width CWa of the first driving transistor DTa may be decreased from 2260 $\mu m$ to 1350 $\mu m$ in the direction from the boundary of the first area R1 and the second area R2 to the notch NT (i.e. the first direction D1), and the descending time (or the slope of the descending portion) of the first signal output waveform of each of the gate driving units SRa may be maintained at 0.954 $\mu s$ to 0.956 $\mu s$, but this is not limited thereto.

As shown in FIG. 5A and FIG. 6A, the display panel 10 may further include a sealant 118 (the boundary of the sealant 118 is shown by the thick solid line) disposed in the peripheral PR, wherein the first gate driving unit and the second gate driving unit are at least partially covered by the sealant 118. Since the sealant 118 in this embodiment may be a photocurable adhesive, a plurality of light-passing openings (such as opening O1) may be disposed in the first gate driving unit SRa and the second gate driving unit SRb, and these openings may overlap with the sealant 118 to aid in curing of the photocurable adhesive. The conventional methods of applying a photocurable adhesive leave a large amount of residue at the corners. Since the notch NT in this embodiment is disposed in the first area R1, there are more corners in the first area R1, so that the photocurable adhesive in the first area R1 is relatively harder to be cured than the photocurable adhesive in other portions of the peripheral region PR.

In order to solve the above problem, through reducing at least one of the widths of the source electrode S1a and the drain electrode D1a (the second conductive layer 114) and the width of the patterned semiconductor layer C1a (semiconductor layer 116) of each first gate driving unit SRa in the first direction D1, a portion of the first conductive layer 112 that is above and below the first driving transistor DTa in the first direction D1 may be exposed. Furthermore, the first gate driving unit SRa of this embodiment further includes two openings O2 formed in the exposed portion of the first conductive layer 112, wherein the openings O2 may overlap with the sealant 118, one of the openings O2 is disposed on one side of the first driving transistor DTa in the first direction D1, and another opening O2 is disposed on the other side of the first driving transistor DTa in the first direction D1, such that the first driving transistor DTa is disposed between the two openings O2. The openings O2 may be rectangular and have a long side parallel to the second direction D2, but are not limited thereto. In addition, the number of the openings O2 is not limited to that shown in this embodiment. Accordingly, through providing the openings O2, the light-passing area in the first gate driving unit SRa may be increased so that the problem of poor curing of the photocurable adhesive at the corner position is improved.

Figure 10:
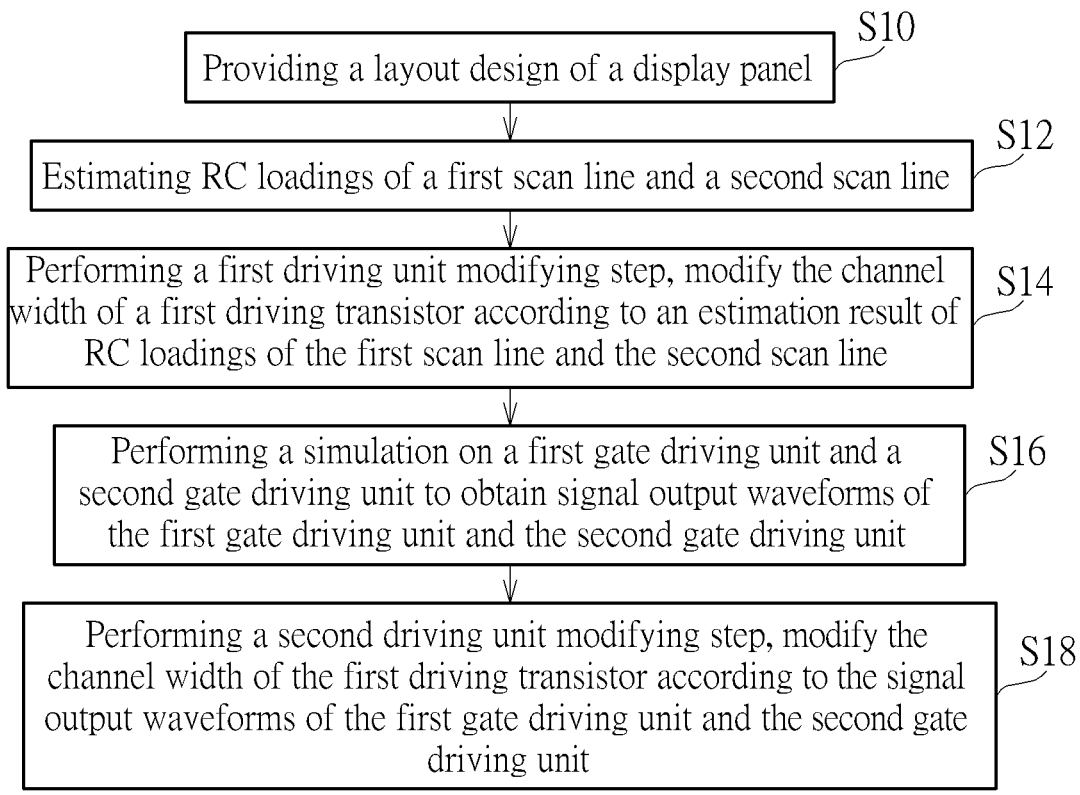
FIG. 10 is a flowchart showing steps of improving the display quality of the display panel of the present invention.

The method of improving the display quality of the display panel of this embodiment will be described in detail below. FIG. 10 is a flow chart showing steps of improving the display quality of the display panel of the present invention. First, step S10 is performed to provide a layout design of the display panel 10, wherein the display panel 10 includes the substrate 100, the plurality of first sub pixels SP1, the plurality of second sub pixels SP2, the plurality of first gate driving units SRa and the plurality of second gate driving units SRb.

The substrate 100 has a surface, wherein the surface includes the display region DR and the peripheral region PR disposed on at least one side of the display region DR. The display region DR includes the first area R1 and the second area R2, wherein the first area R1 has one or more than one first scan line SL1, and the second area R2 has one or more than one second scan line SL2. In addition, the shape of the first area R1 includes a notch NT. The first sub pixels SP1 are disposed in the first area R1, wherein each of the first scan lines SL1 is electrically connected to at least a portion of the first sub pixels SP1. The second sub pixels SP2 are disposed in the second area R2, wherein each of the second scan lines SL2 is electrically connected to at least a portion of the second sub pixels SP2.

The first gate driving units SRa are disposed in the peripheral region PR, each of the first gate driving units SRa has a first driving transistor DTa, each of the first gate driving units SRa is electrically connected to one first scan line SL1, and the first sub pixels SP1 electrically connected to the corresponding first scan line SL1 are driven through this first scan line SL1 by the corresponding first gate driving units SRa. The second gate driving units SRb are disposed in the peripheral PR, each of the second gate driving units SRb has a second driving transistor DTb, each of the second gate driving units SRb is electrically connected to one second scan line SL2, and the second sub pixels SP2 electrically connected to the corresponding second scan line SL2 are driven through this second scan line SL2 by the corresponding second gate driving units SRb. In addition, since the shape of the first area R1 includes a notch NT, the number of the first sub pixels SP1 driven by each of the first gate driving units SRa is less than the number of the second sub pixels SP2 driven by each of the second gate driving units SRb.

Next, step S12 is performed to estimate the RC loading of the first scan line SL1 and the RC loading of the second scan line SL2. Since the number of the first sub pixels SP1 electrically connected to the first scan line SL1 is different from the number of the second sub pixels SP2 electrically connected to the second scan line SL2, the RC loading when the signal is transmitted in the first scan line SL1 is different from the RC loading when the signal is transmitted in the second scan line SL2. For example, since the number of the first sub pixels SP1 electrically connected to the first scan line SL1 is less than the number of the second sub pixels SP2 electrically connected to the second scan line SL2, the RC loading of the first scan lines SL1 is less than the RC loading of the second scan lines SL2 in this embodiment.

Then, step S14 is performed to provide a first driving unit modifying step. In this step, the channel width of the first gate transistor DTa in the first gate driving unit SRa is modified (e.g. reduce the width) according to the channel width of the second driving unit DTb in the second gate driving unit SRb (as shown in FIG. 6) and according to the estimation results of the RC loadings of the first scan line SL1 and the second scan line SL2.

Next, step S16 is performed, wherein a simulation is performed on the first gate driving unit SRa and the second gate driving unit SRb to obtain a plurality of signal output waveforms of the first gate driving unit SRa and the second gate driving unit SRb, wherein the signal output waveforms may be known by referring to FIG. 9 and the related description. At this time, the signal output waveforms of the first gate driving unit SRa and the second gate driving unit SRb may be compared to obtain the difference between the descending times or the slopes of the descending portions between different signal output waveforms.

Then, step S18 is performed to provide a second driving unit modifying step. In this step, the channel width (or area) of the first gate transistor DTa is modified according to the signal output waveforms of the first gate driving unit SRa and the second gate driving unit SRb. For example, in the second driving unit modifying step, the channel width (or area) of the first driving transistor DTa in the first gate driving unit SRa may be modified according to the slope difference between the descending portions of signal output waveforms, or the channel width (or area) of the first driving transistor DTa in the first gate driving unit SRa may be modified according to the descending time difference between the signal output waveforms.

In this embodiment, since the RC loading of the first scan line SL1 is less than the RC loading of the second scan line SL2, the methods of modifying the channel width (or area) in the first driving unit modifying step (S14) or the second driving unit modifying step (S18) may, for example, be reducing the area of the source electrode S1$a$ and the drain electrode D1$a$ of the first driving transistor DTa (thin film transistor M1$a$), such that it may be smaller than the area of the source electrode S1$b$ and drain electrode D1$b$ of the second driving transistor DTb (thin film transistor M1$b$), as shown in FIG. 5 and FIG. 6. Furthermore, the method of modifying the channel width (or area) of the first driving transistor DTa may also reduce the area of the patterned semiconductor layer C1$a$ of the first driving transistor DTa at the same time, such that it may be smaller than the area of the patterned semiconductor layer C1$b$ of the second driving transistor DTb.

After the second driving unit modifying step, a simulation or measurement is performed to obtain a first signal output waveform corresponding to the first gate driving unit SRa and a second signal output waveform corresponding to the second gate driving unit SRb, wherein the difference between the descending time of the first signal output waveform and the descending time of the second signal output waveform is less than or equal to 2%, and the difference between the slope of the descending portion of the first signal output waveform and the slope of the descending portion of the second signal output waveform is also less than or equal to 2%.

For example, after the first driving unit modifying step and the second driving unit modifying step, the channel width CWa of the first driving transistor DTa of one of the first gate driving units SRa in this embodiment is 1350 µm, and the channel width CWb of the second driving transistor DTb of one of the second gate driving units SRb is 2436 µm. In the first signal output waveform of the first gate driving unit SRa and the second signal output waveform of the second gate driving unit SRb, the descending time of the first signal output waveform is 0.955 µs, and the descending time of the second signal output waveform is 0.956 µs, wherein the difference between the descending times is about 0.1%. In other words, the difference between the slope of the descending portion of the first signal output waveform and the slope of the descending portion of the second signal output waveform is also about 0.1%.

According to the above, in this embodiment, the area or the channel width of the first driving transistor DTa is modified by the first driving unit modifying step and the second driving unit modifying step, such that the difference between the final corresponding first signal output waveform and the second signal output waveform is effectively reduced. Accordingly, through the method of improving the display quality of the display panel in this embodiment, the driving power of each of the first gate driving units SRa may match with the corresponding RC loading of the first scan line SL1, such that the quality of the scanning signal transmitted in the first area R1 and in the second area R2 may be consistent. The problem of uneven brightness in different areas of the display panel 10 is improved, thereby improving the display quality.

The display panel and the method of improving the display quality of the display panel of the present invention are not limited to the aforementioned embodiment. The following description continues to detail other embodiments or variant embodiments. To simplify the description and show the difference between other embodiments, variant embodiments and the above-mentioned embodiment, identical components in each of the following embodiments are marked with identical symbols, and the identical features will not be redundantly described.

Figure 11:
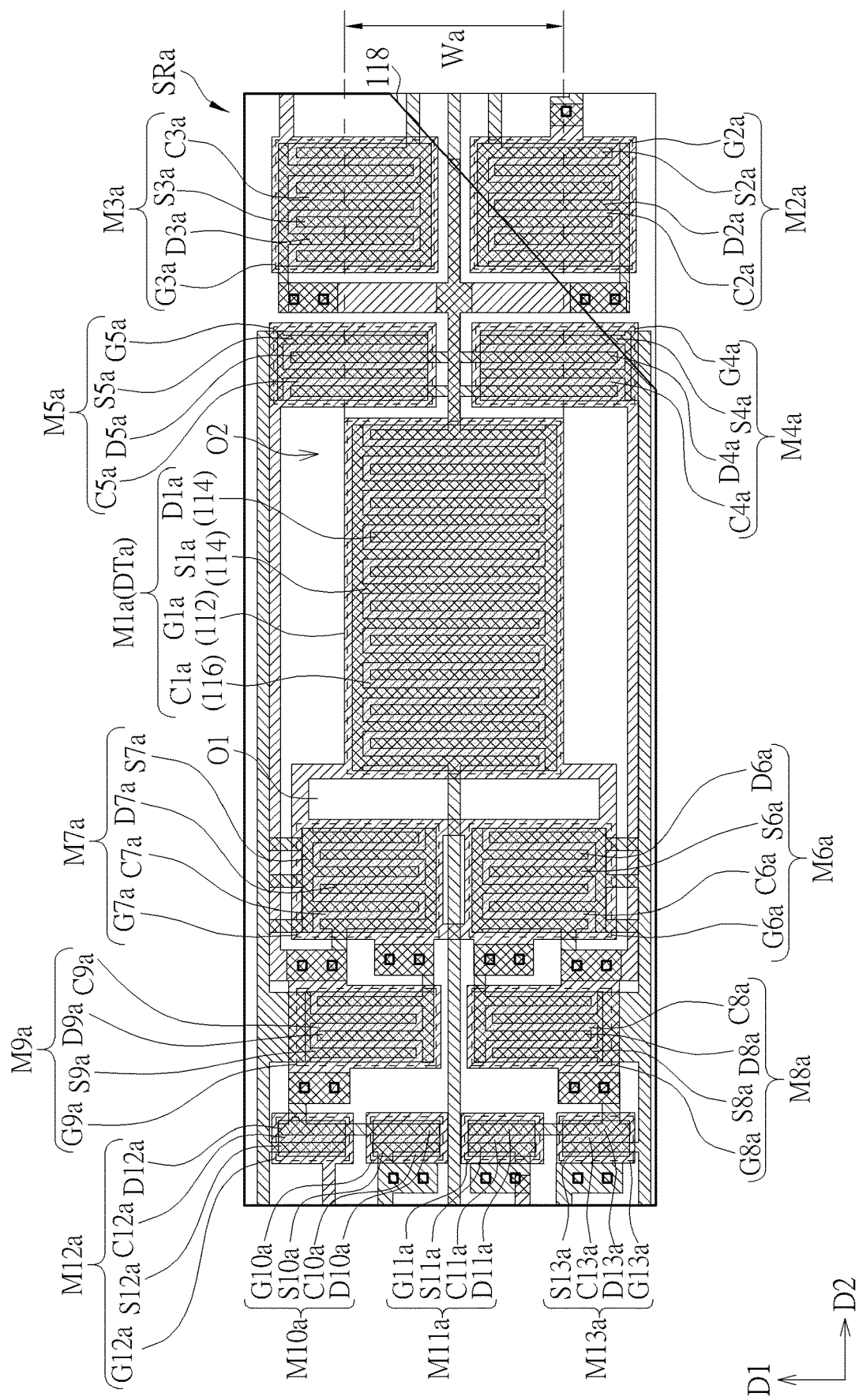
FIG. 11 is a schematic diagram illustrating a circuit layout of a first gate driving unit according to a second embodiment of the present invention.

FIG. 11 is a schematic diagram illustrating a circuit layout of a first gate driving unit according to a second embodiment of the present invention. As shown in FIG. 11, a difference between this embodiment and the first embodiment is that in the first direction D1, the width Wa of a portion of the first conductive layer 112 forming the gate G1a of the first driving transistor DTa (thin film transistor M1a) is also reduced as the width of the thin film transistor M1a is reduced. Therefore, the width Wa of a portion of the first conductive layer 112 forming the gate G1a of the first driving transistor DTa is less than a width Wb of a portion of the first conductive layer 112 forming the gate G1b of the second driving transistor DTb. Accordingly, in the first direction D1, two openings O2 are formed in a portion of the first conductive layer 112 on the upper side and lower side of the first driving transistor DTa. The openings O2 may overlap with the sealant 118 and may increase the light-passing area in the first gate driving unit SRa, and the problem of poor curing of the photocurable adhesive at the corner position is thereby improved.

Another difference between this embodiment and the first embodiment is that the area or channel width of the thin film transistors M2a-M13a in each of the first gate driving units SRa is not reduced, and only the area or channel width of the first driving transistor DTa is reduced. For example, the area or the channel width of the thin film transistors M2a-M13a may be equal to the area or the channel width of the thin film transistors M2b-M13b in each of the second gate driving units SRb, but this is not limited thereto.

In addition, the features in each of the embodiments may be exchanged with each other. For example, in one embodiment, in the first direction D1, a width of a portion of the first conductive layer 112 forming the gate G1a of the first driving transistor DTa (thin film transistor M1a) is not reduced as the width of the thin film transistor M1a is reduced, such as in the first embodiment; however, the area or channel width of the thin film transistors M2a-M13a in each of the first gate driving units SRa is not reduced, and only the area or channel width of the first driving transistor DTa is reduced, such as in the second embodiment. In another embodiment, in the first direction D1, the width of a portion of the first conductive layer 112 forming the gate G1a of the first driving transistor DTa (thin film transistor M1a) is reduced as the width of the thin film transistor M1a is reduced, such as in the second embodiment; however, the area or channel width of the thin film transistors M2a-M13a in each of the first gate driving units SRa is reduced, and the area or channel width of the first driving transistor DTa is also reduced, as in the first embodiment.

To sum up, in the display panel and method of improving display quality of the present invention, the driving power of the first gate driving unit is reduced by reducing the area or the channel width of the first driving transistor according to the RC loading of the first scan line, and the driving power of each of the first gate driving units is matched with the corresponding RC loading of the first scan line, so that the quality of the scanning signals transmitted in the first area and the second area are consistent. The difference between the descending time of the first signal output waveform of each of the first gate driving units and the descending time of the second signal output waveform of each of the second gate driving units is less than or equal to 2%, and the difference between the slope of the descending portion of the first signal output waveform and the slope of the descending portion of the second signal output waveform is also less than or equal to 2%, so that the problem of uneven brightness in different areas of the display panel is improved, thereby improving the display quality. In addition, two openings are disposed in the portion of the first conductive layer at the upper or lower side of the first driving transistor in the first direction, which may increase the light-passing area in the first gate driving unit so that the problem of poor curing of the photocurable adhesive at the corner positions is improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A display panel, comprising:
    a substrate having a surface, wherein the surface includes a display region and a peripheral region disposed on at least one side of the display region, wherein the display region includes a first area and a second area, the first area includes a first scan line and the second area includes a second scan line;
    a plurality of first sub pixels disposed in the first area, wherein at least a portion of the first sub pixels are electrically connected to the first scan line;
    a plurality of second sub pixels disposed in the second area, wherein at least a portion of the second sub pixels are electrically connected to the second scan line;
    a first gate driving unit disposed in the peripheral region, wherein the first gate driving unit has a first driving transistor, the first gate driving unit is electrically connected to the first scan line, and the portion of the first sub pixels electrically connected to the first scan line are driven through the first scan line by the first gate driving unit; and
    a second gate driving unit disposed in the peripheral region, wherein the second gate driving unit has a second driving transistor, the second gate driving unit is electrically connected to the second scan line, and the portion of the second sub pixels electrically connected to the second scan line are driven through the second scan line by the second gate driving unit,
    wherein a number of the first sub pixels driven by the first gate driving unit are less than a number of the second sub pixels driven by the second gate driving unit, and a channel width of the first driving transistor is less than a channel width of the second driving transistor,
    wherein a gate electrode of the first driving transistor and a gate electrode of the second driving transistor are formed by a first conductive layer, a source electrode and a drain electrode of the first driving transistor and a source electrode and a drain electrode of the second driving transistor are formed by a second conductive layer, the first conductive layer is disposed between the second conductive layer and the substrate, and an area of the source electrode and the drain electrode of the first driving transistor is less than an area of the source electrode and the drain electrode of the second driving transistor, wherein the first gate driving unit includes at least one opening disposed at one side of the first driving transistor in a first direction, the opening is formed in the first conductive layer, the first scan line and the second scan line extend in a second direction, and the first direction and the second direction are not parallel.

2. The display panel according to claim 1, further comprising a sealant disposed in the peripheral region, wherein the first gate driving unit and the second gate driving unit are at least partially covered by the sealant, and the sealant and the opening of the first gate driving unit are at least partially overlapping.

3. The display panel according to claim 1, wherein the first gate driving unit includes a first signal output waveform, the second gate driving unit includes a second signal output waveform, and a difference between a slope of a descending part of the first signal output waveform and a slope of a descending part of the second signal output waveform is less than or equal to 2%.

4. The display panel according to claim 1, wherein the first gate driving unit includes a first signal output waveform, the second gate driving unit includes a second signal output waveform, and a difference between a descending time of the first signal output waveform and a descending time of the second signal output waveform is less than or equal to 2%.

5. A method of improving the display quality of a display panel, comprising:
   providing a layout design of a display panel, comprising:
      a substrate having a surface, wherein the surface includes a display region and a peripheral region disposed on at least one side of the display region, wherein the display region includes a first area and a second area, the first area has a first scan line and the second area has a second scan line;
      a plurality of first sub pixels disposed in the first area, wherein at least a portion of the first sub pixels are electrically connected to the first scan line;
      a plurality of second sub pixels disposed in the second area, wherein at least a portion of the second sub pixels are electrically connected to the second scan line;
      a first gate driving unit disposed in the peripheral region, wherein the first gate driving unit has a first driving transistor, the first gate driving unit is electrically connected to the first scan line, and the portion of the first sub pixels electrically connected to the first scan line are driven through the first scan line by the first gate driving unit; and
      a second gate driving unit disposed in the peripheral region, wherein the second gate driving unit has a second driving transistor, the second gate driving unit is electrically connected to the second scan line, and the portion of the second sub pixels electrically connected to the second scan line are driven through the second scan line by the second gate driving unit, wherein a number of the first sub pixels driven by the first gate driving unit are less than a number of the second sub pixels driven by the second gate driving unit;

estimating a resistive-capacitive loading (RC loading) of the first scan line and a RC loading of the second scan line;

performing a first driving unit modifying step comprising modifying a channel width of the first driving transistor according to an estimation result of the RC loadings of the first scan line and the second scan line;

performing a simulation on the first gate driving unit and the second gate driving unit to obtain a plurality of signal output waveforms of the first gate driving unit and the second gate driving unit; and performing a second driving unit modifying step comprising modifying the channel width of the first driving transistor according to the plurality of signal output waveforms of the first gate driving unit and the second gate driving unit.

6. The method of improving the display quality of the display panel according to claim 5, wherein the second driving unit modifying step comprises modifying the channel width of the first driving transistor in the first gate driving unit according to slope differences between a plurality of descending portions of the plurality of signal output waveforms.

7. The method of improving the display quality of the display panel according to claim 6, wherein after performing the second driving unit modifying step, a difference between a slope of a descending portion of a first signal output waveform of the first gate driving unit and a slope of a descending portion of a second signal output waveform of the second gate driving unit is less than or equal to 2%.

8. A display panel, comprising:
   a substrate having a surface, wherein the surface includes a display region and a peripheral region disposed on at least one side of the display region, wherein the display region includes a first area and a second area, the first area includes a first scan line and the second area includes a second scan line;
   a plurality of first sub pixels disposed in the first area, wherein at least a portion of the first sub pixels are electrically connected to the first scan line;
   a plurality of second sub pixels disposed in the second area, wherein at least a portion of the second sub pixels are electrically connected to the second scan line;
   a first gate driving unit disposed in the peripheral region, wherein the first gate driving unit has a first driving transistor, the first gate driving unit is electrically connected to the first scan line, and the portion of the first sub pixels electrically connected to the first scan line are driven through the first scan line by the first gate driving unit; and
   a second gate driving unit disposed in the peripheral region, wherein the second gate driving unit has a second driving transistor, the second gate driving unit is electrically connected to the second scan line, and the portion of the second sub pixels electrically connected to the second scan line are driven through the second scan line by the second gate driving unit,
   wherein a number of the first sub pixels driven by the first gate driving unit are less than a number of the second sub pixels driven by the second gate driving unit, and a channel width of the first driving transistor is less than a channel width of the second driving transistor,
   wherein the first gate driving unit includes a first signal output waveform, the second gate driving unit includes a second signal output waveform, and a difference between a slope of a descending part of the first signal output waveform and a slope of a descending part of the second signal output waveform is less than or equal to 2%.

9. A display panel, comprising:

a substrate having a surface, wherein the surface includes a display region and a peripheral region disposed on at least one side of the display region, wherein the display region includes a first area and a second area, the first area includes a first scan line and the second area includes a second scan line;

a plurality of first sub pixels disposed in the first area, wherein at least a portion of the first sub pixels are electrically connected to the first scan line;

a plurality of second sub pixels disposed in the second area, wherein at least a portion of the second sub pixels are electrically connected to the second scan line;

a first gate driving unit disposed in the peripheral region, wherein the first gate driving unit has a first driving transistor, the first gate driving unit is electrically connected to the first scan line, and the portion of the first sub pixels electrically connected to the first scan line are driven through the first scan line by the first gate driving unit; and a second gate driving unit disposed in the peripheral region, wherein the second gate driving unit has a second driving transistor, the second gate driving unit is electrically connected to the second scan line, and the portion of the second sub pixels electrically connected to the second scan line are driven through the second scan line by the second gate driving unit, wherein a number of the first sub pixels driven by the first gate driving unit are less than a number of the second sub pixels driven by the second gate driving unit, and a channel width of the first driving transistor is less than a channel width of the second driving transistor, wherein the first gate driving unit includes a first signal output waveform, the second gate driving unit includes a second signal output waveform, and a difference between a descending time of the first signal output waveform and a descending time of the second signal output waveform is less than or equal to 2%.

* * * * *